United States Patent
Leddige et al.

(10) Patent No.: US 6,711,640 B1
(45) Date of Patent: Mar. 23, 2004

(54) SPLIT DELAY TRANSMISSION LINE

(75) Inventors: Michael W. Leddige, Beaverton, OR (US); James A. McCall, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 420 days.

(21) Appl. No.: 09/823,147

(22) Filed: Mar. 29, 2001

(51) Int. Cl.$^7$ .................. G06F 13/00; G06F 13/14; H05K 7/02; H05K 1/11; H03K 17/16
(52) U.S. Cl. .................. 710/100; 710/305; 361/760; 361/803; 326/30
(58) Field of Search ................. 710/100, 305; 365/52, 51; 324/527, 528; 438/129; 326/30, 41; 361/803, 299.2, 298.4, 306.1, 308.3, 760, 777

(56) References Cited

U.S. PATENT DOCUMENTS

| | | | |
|---|---|---|---|
| 6,067,594 A | | 5/2000 | Perino et al. |
| 6,381,164 B1 | * | 4/2002 | Fan et al. .................. 365/51 |
| 6,438,012 B1 | * | 8/2002 | Osaka et al. .................. 365/52 |
| 6,578,125 B2 | * | 6/2003 | Toba .................. 711/167 |

* cited by examiner

*Primary Examiner*—Tim Vo
(74) *Attorney, Agent, or Firm*—Mark V. Seeley

(57) ABSTRACT

A computer motherboard is described. That motherboard includes a memory controller and a memory section. A first trace couples the memory controller to the memory section, and a second trace couples the memory controller to the memory section. The first trace is joined with the second trace at the memory controller, the second trace is routed in parallel with the first trace, and the second trace is longer than the first trace. Also described is a computer system that includes this motherboard and a memory card.

1 Claim, 4 Drawing Sheets

SPLIT DELAY TRANSMISSION LINE

FIELD OF THE INVENTION

The present invention relates to motherboard interconnects.

BACKGROUND OF THE INVENTION

FIG. 1 represents a computer system that includes a typical DRAM bus far end cluster. System 100 includes memory controller 101 that is coupled to far end cluster 102 at "T" junction 103 by relatively long trace 104. Far end cluster 102 includes several closely spaced DRAMs 105. DRAMs 105 are separated into first set 106 and second set 107 at junction 103. First signal line 108 passes from junction 103 to last DRAM 109 included in first set 106 and second signal line 110 passes from junction 103 to last DRAM 111 included in second set 107.

Impedance mismatch between trace 104 and the combination of signal lines 108,110 may result in poor signal integrity for signals that DRAMs 105 receive. FIG. 2 represents a signal waveform that may result when driving a signal into a low impedance far end cluster—like the one illustrated in FIG. 1. Because of the impedance mismatch, signal reflections, which occur when a signal reaches the cluster, produce ledges 201. The load that DRAMs 105 present on signal lines 108, 110, can cause those ledges, e.g., ledge 202, to have slope reversal (i.e., regions where a rising edge experiences a short voltage drop or where a falling edge experiences a short voltage rise).

To prevent such ledges from occurring at the DRAM receiver's switching threshold, stable system design may require all timings to be taken after the ledges. For example, if a ledge with slope reversal occurs on a signal's rising edge, it may be necessary to delay the latching of data to ensure that the receiver properly detects a voltage that exceeds the switching threshold. Adding delay to ensure that the receiver switches state as intended may reduce the maximum speed at which signals are driven between memory controller 101 and DRAMs 105. Even when adding this delay, unless there is sufficient noise margin, such ledges might still cause a false trigger to occur, when data is to be latched into a DRAM, if they cause the slew rate to be insufficient to change the state of the input receiver at that time.

For example, lines 203 and 204 may designate the input voltage levels required for the receiver to switch—line 203 designating the input high voltage ("Vih") and line 204 designating the input low voltage ("Vil"). When a rising edge passes through Vih, the DRAM receiver will switch from a first state to a second state (e.g., a low state to a high state.) Likewise, when a falling edge passes through Vil, the DRAM receiver will switch from a first state to a second state. The DRAM receiver will properly switch state as long as the voltage exceeds the switching threshold (for a rising edge), or falls below the switching threshold (for a falling edge), when the receiver latches data. As long as ledges 201 occur outside of the switching region, they should not prevent the correct latching of data into the receiver. As a result of system noise, however, receiver thresholds could change dynamically causing ledges, including ledges with slope reversal, to develop within the switching region—even when the system was designed to prevent that effect. If that occurs, incorrect data might be latched into the receiver.

Accordingly, there is a need for an improved motherboard interconnect that prevents formation of ledges with slope reversal as a signal rises and falls. There is a need for such a motherboard interconnect that enables DRAM receivers to latch data at a relatively high frequency without risk that such ledges will develop, which cause the receiver to accept incorrect data. The present invention provides such a motherboard interconnect.

DETAILED DESCRIPTION OF THE PRESENT INVENTION

A computer motherboard is described. That motherboard includes a memory controller and a memory section. The memory controller is coupled to the memory section by first and second traces. The first trace is joined with the second trace at the memory controller, the second trace is routed in parallel with the first trace, and the second trace is longer than the first trace. Also described is a computer system that includes this motherboard and a memory card.

In the following description, numerous specific details are set forth such as component types, dimensions, etc., to provide a thorough understanding of the present invention. However, it will be apparent to those skilled in the art that the invention may be practiced in many ways other than those expressly described here. The invention is thus not limited by the specific details disclosed below.

Figure 3:
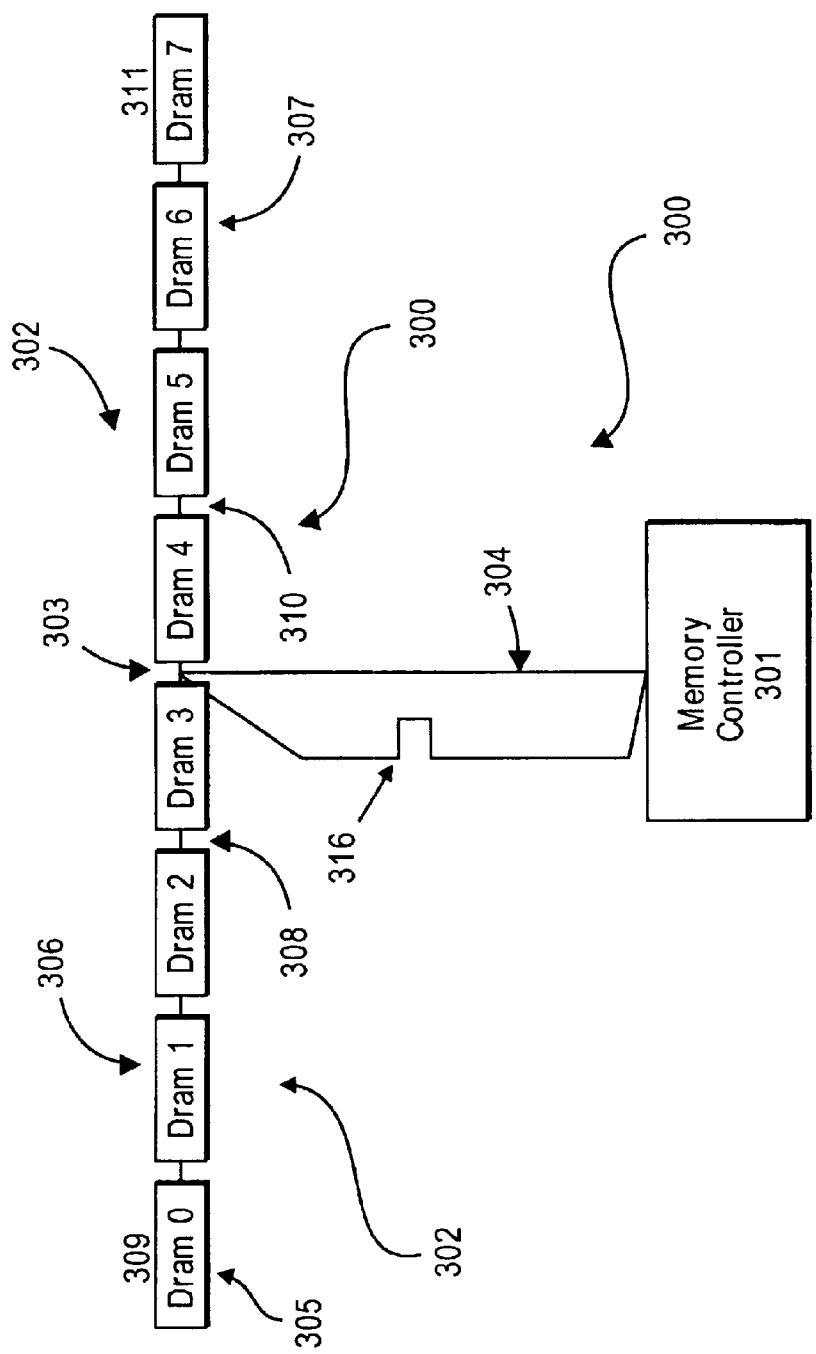
FIG. 3 represents an embodiment of the motherboard of the present invention.

FIG. 3 represents an embodiment of a motherboard that implements the present invention. Motherboard 300 includes memory controller 301 and memory section 315. First trace 304 and second trace 316 couple memory section 315 to memory controller 301. First trace 304 and second trace 316 are joined at memory controller 301. Second trace 316 is routed in parallel with first trace 304, and second trace 316 is longer than first trace 304. Traces 304, 316 may be routed on the same printed circuit board ("PCB") layer, or, alternatively, may be routed on different PCB layers.

In this embodiment, a plurality of memory devices, e.g., DRAMs, 305 form far end cluster 302. DRAMs 305 may be mounted directly to motherboard 300, or, alternatively, mounted onto a memory card that may be inserted into a socket that is mounted onto motherboard 300 at memory section 315. DRAMs 305 are separated into first set 306, which includes four DRAMs, and second set 307, which also includes four DRAMs, at "T" junction 303. First and second traces 304, 316 meet at junction 303. Junction 303 may be located on motherboard 300, when DRAMs 305 are directly mounted to it, or instead be located on a memory card. DRAMs 305 preferably are closely spaced, such that they are separated from each other by between about 0.1 inch and about 1 inch. In embodiments where DRAMs are mounted onto one side of motherboard 300, or onto one side of a memory card, DRAMs 305 are preferably separated by between about 0.5 inch and about 1 inch. When DRAMs 305 are mounted to both sides of a memory card (e.g., with DRAMs 0, 2, 4, and 6 mounted to one side of the memory card, and DRAMs 1, 3, 5, and 7 mounted to the other side), they preferably are separated by between about 0.1 inch and about 0.5 inch.

First signal line 308 passes from junction 303 to last DRAM 309 included in first set 306 and second signal line 310 passes from junction 303 to last DRAM 311 included in second set 307. In a preferred embodiment of the present invention, the length of second trace 316 exceeds the length of first trace 304 by an amount that ensures that the additional time required for a signal to pass over second trace 316 from memory controller 301 to junction 303, when compared to the time required for a signal to pass over first trace 304 from memory controller 301 to junction 303, is about equal to the time required for a signal to pass from junction 303 to last DRAMs 309, 311. The degree to which the length of trace 316 must exceed the length of trace 304 to meet this objective will depend upon the number of DRAMs that are included in far end cluster 302 and the amount of separation between those DRAMs.

In a preferred embodiment, first trace 304 should be between about 4 and about 8 inches long and second trace 316 should be between about 2 and about 6 inches longer than trace 304. For example, if first trace 304 is about 4 inches long, then second trace 316 should be between about 6 and about 10 inches long—depending upon the signal delay needed to match the time required for a signal to pass from junction 303 to DRAMs 309, 311. If first trace 304 is about 8 inches long, then second trace 316 should be between about 10 and about 14 inches long. Traces 304, 316 and signals lines 308, 310 preferably should each have a width that is between about 0.003 and about 0.008 inches.

Figure 1:
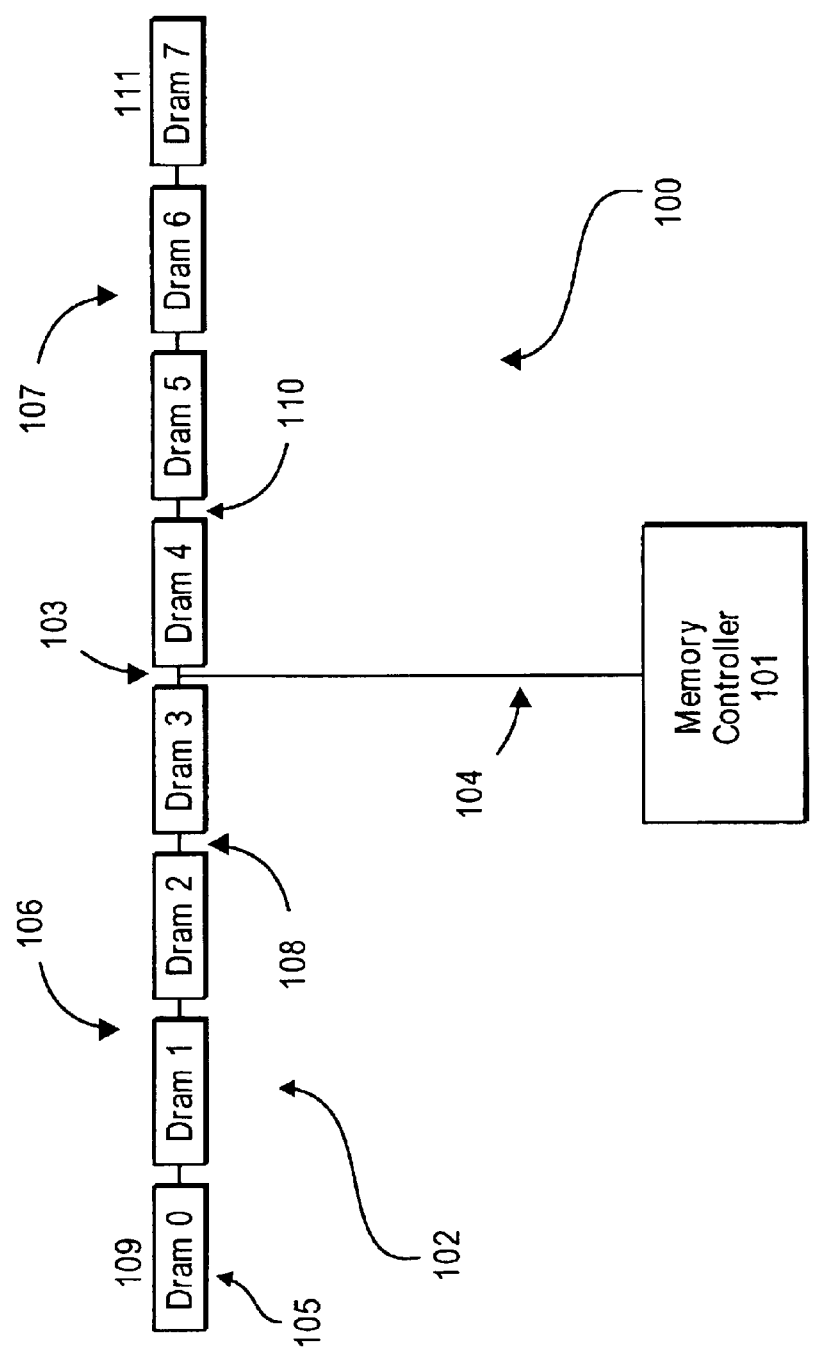
FIG. 1 represents a computer system that includes a DRAM bus far end cluster.
Figure 2:
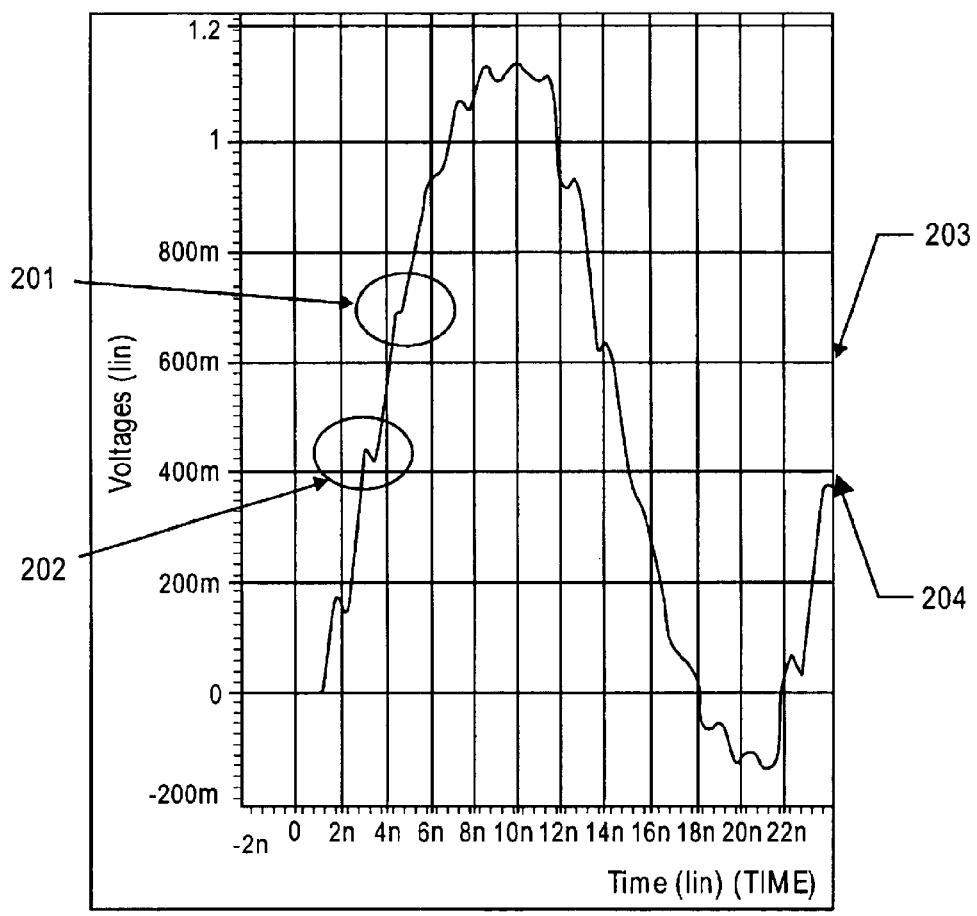
FIG. 2 illustrates a signal waveform that may result when driving a signal into a low impedance far end cluster like the one illustrated in FIG. 1.
Figure 4:
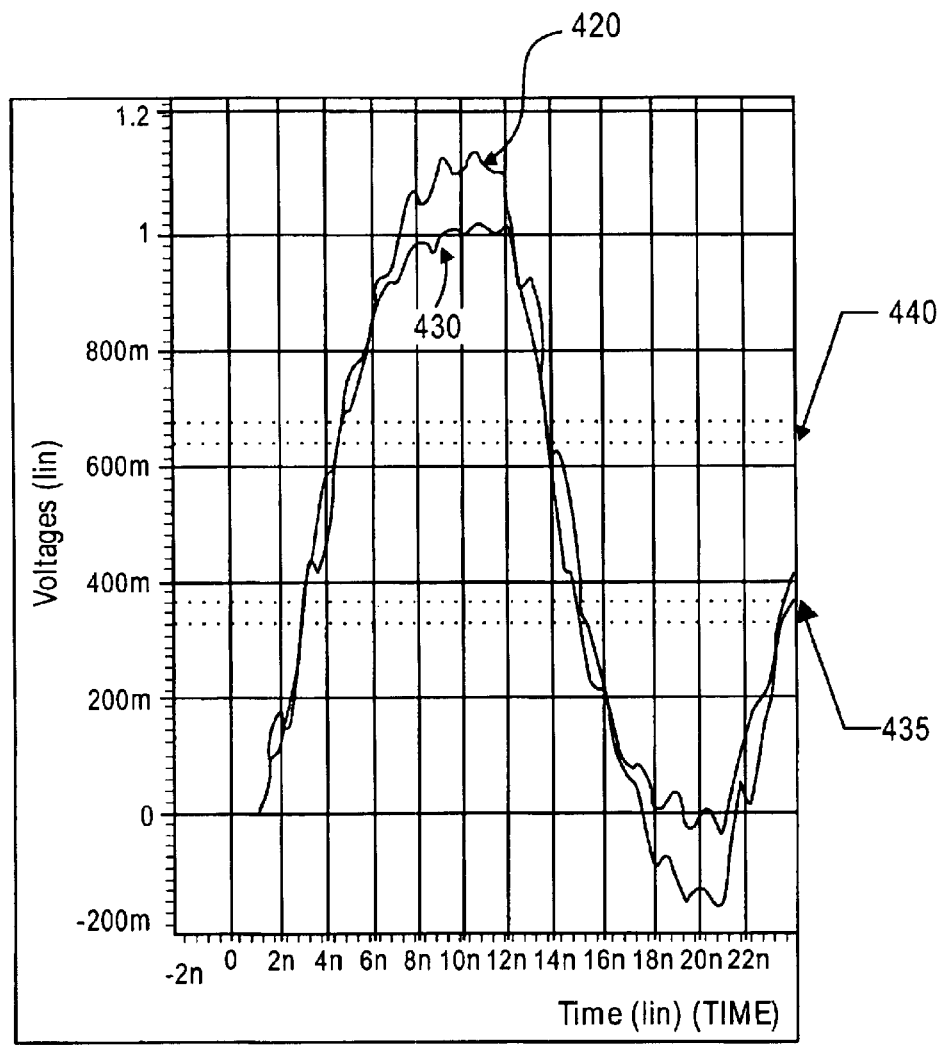
FIG. 4 contrasts the signal waveform of FIG. 2 with a signal waveform that may result when driving a signal over the motherboard of FIG. 3 and into a low impedance far end cluster.

FIG. 4 contrasts signal waveform 420 of FIG. 2 with signal waveform 430, which may result when driving a signal over the motherboard of FIG. 3 and into a low impedance far end cluster. Adding second trace 316 removes from the waveform ledges that have slope reversal. In addition, adding second trace 316 increases the slew rate, as any slew rate reduction that results from delaying one-half of the signal edge is more than compensated for by the slew rate increase that results from removing ledges with slope reversal. Increasing slew rate enables switching threshold expansion, which in turn enhances a system's tolerance to noise. Note that all slope reversal near input receiver thresholds is eliminated and the edge is monotonic, even when Vil 435 is lowered to 350 or 300 and Vih 440 is raised to 650 or 700, extending receiver thresholds to 350–650 and 300–700 mV.

An improved motherboard interconnect has been described. That interconnect reduces impedance mismatch by adding a second trace between a memory controller and a DRAM far end cluster, and eliminates slope reversal in the signal waveform by making one trace longer than the other. Features shown in the above referenced drawings are not intended to be drawn to scale, nor are they intended to be shown in precise positional relationship. Additional features that may be integrated into the motherboard interconnect of the present invention have been omitted as they are not useful to describe aspects of the present invention. Although the foregoing description has specified a motherboard interconnect that includes certain features, those skilled in the art will appreciate that many modifications and substitutions may be made. For example, the layout for traces 304 and 316 may differ from the one shown here. In addition, a motherboard that includes the described interconnect falls within the spirit and scope of the present invention, even if its memory section (i.e., the section of the motherboard that will receive memory devices) is not yet populated with memory devices. Accordingly, it is intended that all such modifications, alterations, substitutions and additions be considered to fall within the spirit and scope of the invention as defined by the appended claims.

What is claimed is:

1. A computer motherboard comprising:

a memory controller;

a memory section that includes a plurality of memory devices that are separated into a first set and a second set at a junction;

a first trace coupling the memory controller to the memory section; and a second trace coupling the memory controller to the memory section, the first trace joined with the second trace at the memory controller and at the junction, the second trace routed in parallel with the first trace, and the second trace being longer than the first trace;

wherein the first trace is between about 4 inches and about 8 inches long, the second trace is at least about 2 inches longer than the first trace and is between about 6 and about 14 inches long, and the memory devices are separated from each other by between about 0.1 inch and about 1 inch.

* * * * *